(12) United States Patent
Kim et al.

(10) Patent No.: US 9,190,597 B2
(45) Date of Patent: Nov. 17, 2015

(54) POWER-GENERATING SYSTEM

(75) Inventors: Yoonho Kim, Shiga (JP); Takeshi Serizawa, Shiga (JP); Hirohisa Tanaka, Shiga (JP); Tadachika Nakayama, Niigata (JP); Masatoshi Takeda, Niigata (JP); Noboru Yamada, Niigata (JP); Koichi Niihara, Niigata (JP)

(73) Assignee: DAIHATSU MOTOR CO., LTD., Osaka (JP)

( * ) Notice: Subject to any disclaimer, the term of this patent is extended or adjusted under 35 U.S.C. 154(b) by 21 days.

(21) Appl. No.: 13/634,854

(22) PCT Filed: Mar. 30, 2011

(86) PCT No.: PCT/JP2011/058103
§ 371 (c)(1),
(2), (4) Date: Sep. 13, 2012

(87) PCT Pub. No.: WO2011/135970
PCT Pub. Date: Nov. 3, 2011

(65) Prior Publication Data
US 2013/0002091 A1 Jan. 3, 2013

(30) Foreign Application Priority Data

Apr. 28, 2010 (JP) ................. 2010-103270

(51) Int. Cl.
*H02N 2/18* (2006.01)
*H01L 35/30* (2006.01)
*H01L 37/02* (2006.01)

(52) U.S. Cl.
CPC .............. *H01L 37/02* (2013.01); *H01L 35/30* (2013.01); *H02N 2/18* (2013.01); *Y02E 20/14* (2013.01)

(58) Field of Classification Search
CPC ............ H01J 45/00; H02N 3/00; F03G 7/06; H01H 2061/006; H01L 35/30; H01L 37/02; Y02E 20/14
USPC .................................... 310/306, 307
See application file for complete search history.

(56) References Cited

U.S. PATENT DOCUMENTS

| 4,504,761 | A | * | 3/1985 | Triplett | ........................ 310/339 |
| 5,808,648 | A | | 9/1998 | Kubota et al. | |
| 5,968,456 | A | * | 10/1999 | Parise | .......................... 422/174 |
| 2002/0027390 | A1 | | 3/2002 | Ichiki et al. | |
| 2002/0046762 | A1 | * | 4/2002 | Rossi | ........................... 136/201 |

(Continued)

FOREIGN PATENT DOCUMENTS

| DE | 102 56 940 A1 | 7/2004 |
| DE | 10 2006 035 759 A1 | 2/2008 |
| JP | 60-257779 A | 12/1985 |

(Continued)

OTHER PUBLICATIONS

Liebl et al., "The Thermoelectric Generator from BMW is Making Use of Waste Heat", Motortechnische Zeitschrift 0412009, vol. 70, Springer Vieweg, Wiesbaden, Germany.

*Primary Examiner* — Terrance Kenerly
(74) *Attorney, Agent, or Firm* — Jean C. Edwards, Esq.; Edwards Neils PLLC

(57) ABSTRACT

A power-generating system includes a heat source having a temperature that goes up and down over time; a first device that undergoes electric polarization due to a temperature change of the heat source; and a second device that takes out an electric power from the first device.

5 Claims, 17 Drawing Sheets

(56) References Cited

U.S. PATENT DOCUMENTS

2005/0073150 A1  4/2005 Patel et al.
2008/0250788 A1* 10/2008 Nuel et al. ................ 60/641.14

FOREIGN PATENT DOCUMENTS

| JP | 03-177082 | 8/1991 |
| JP | 06-022572 | 1/1994 |
| JP | 07-012009 | 1/1995 |
| JP | 09-254442 | 9/1997 |
| JP | 10-283870 | 10/1998 |
| JP | 11-332266 | 11/1999 |
| JP | 2000-328981 | 11/2000 |
| JP | 2002-078360 | 3/2002 |
| JP | 2003-219672 | 7/2003 |
| JP | 2004-210623 | 7/2004 |
| JP | 2007-165463 A | 6/2007 |
| JP | 2007-288923 | 11/2007 |
| JP | 2008-147304 A | 6/2008 |
| JP | 2009-290960 A | 12/2009 |
| WO | WO-2008/020480 A1 | 2/2008 |

* cited by examiner

FIG.3
(a)
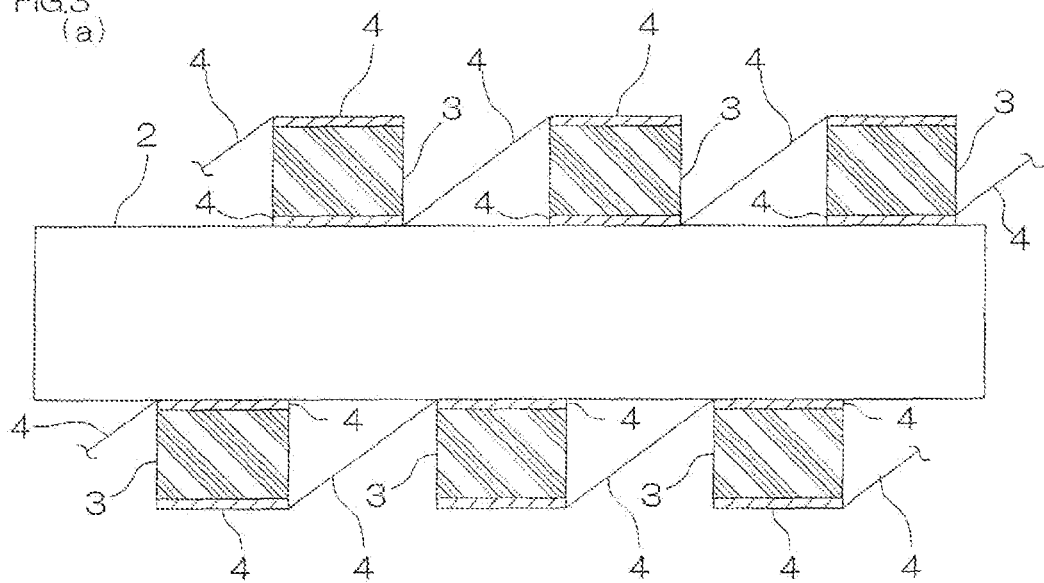
(b)
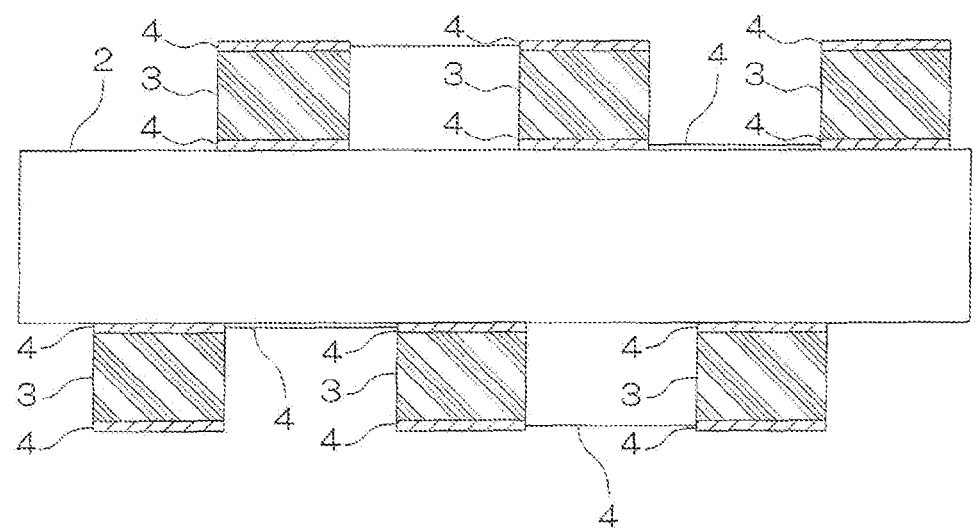

POWER-GENERATING SYSTEM

CROSS-REFERENCE TO RELATED APPLICATIONS

The present invention is a 35 U.S.C. 371 National Stage Entry of PCT/JP2011/058103, filed Mar. 30, 2011, which claims priority from Japanese Patent Application No. 2010-103270, filed on Apr. 28, 2010, the contents all of which are herein incorporated by reference.

TECHNICAL FIELD

The present invention relates to a power-generating system.

BACKGROUND ART

Conventionally, a large amount of heat energy is released and lost as, for example, waste heat, light, etc. in various energy-using devices such as internal combustion engines including an automobile engine; heat exchangers including a boiler and air-conditioning equipment; motor generators including a power generator and a motor; and luminous devices including lightings.

Nowadays, recovery and recycling of released heat energy as an energy source has been required in view of energy conservation, and as such a method, for example, Non-Patent Document 1 below has proposed a thermoelectric generator (TEG), in which an exhaust gas heat exchanger is provided between an exhaust gas purifying catalyst and a muffler in an exhaust gas system of automobiles, and in the exhaust gas heat exchanger, the exhaust gas in the exhaust pipe is homogenized, and a thermoelectric element (thermoelectric module) composed of $Bi_2Te_3$ is disposed between the exhaust pipe and a radiator.

In the thermoelectric generator, the thermoelectric element is disposed between the exhaust pipe warmed by the exhaust gas, and the radiator, and a temperature difference is caused at one side and the other side thereof to generate electricity by the Seebeck effect of the thermoelectric element. The thus obtained electric power is usually stored in onboard batteries via a step-up DC-DC converter, and used suitably as necessary.

CITATION LIST

Non-Patent Document

Non-Patent Document 1 MTZ Motortechnische Zeitschrift 0412009 Volume 70 (Publisher vieweg)

SUMMARY OF THE INVENTION

Problem to be Solved by the Invention

However, in the thermoelectric generator described in the above-described Non-Patent Document 1, the exhaust gas that has been homogenized between the exhaust gas purifying catalyst and the muffler, that is, an exhaust gas having a constant temperature, is used to generate electricity. The electric power obtained by such a method has a small voltage, and is constant (direct current voltage), and therefore is disadvantageous in that efficient boosting of voltage with a simple structure cannot be achieved, and storage of electricity is inefficient.

An object of the present invention is to provide a power-generating system capable of more excellently efficient storage of electricity.

Means for Solving the Problem

A power-generating system of the present invention includes a heat source having a temperature that goes up and down over time; a first device that undergoes electric polarization due to the temperature change of the heat source; and a second device that takes out an electric power from the first device.

In the power-generating system of the present invention, it is preferable that the heat source undergoes a periodic temperature change.

In the power-generating system of the present invention, it is preferable that the second device takes out an electric power expressed as a periodically changing waveform.

In the power-generating system of the present invention, it is preferable that the heat source is an internal combustion engine.

In the power-generating system of the present invention, it is preferable that the first device undergoes electric polarization by the piezoelectric effect.

In the power-generating system of the present invention, it is preferable that the first device undergoes electric polarization by the pyroelectric effect.

In the power-generating system of the present invention, it is preferable that the first device undergoes electric polarization by the Seebeck effect.

In the power-generating system of the present invention, it is preferable that the heat source includes a plurality of heat sources; and the temperature change is caused by switching between the plurality of heat sources.

Effects of the Invention

With the power-generating system of the present invention, a heat source having a temperature that goes up and down over time is used, and therefore a changing voltage can be taken out. Thus, compared with the case where the voltage is taken out as a constant voltage, excellently efficient boosting of voltage and storage of electricity can be achieved with a simple structure.

BRIEF DESCRIPTION OF THE DRAWINGS

FIG. 3 is a schematic diagram illustrating the configuration of another embodiment of the first device shown in FIG. 1.

EMBODIMENT OF THE INVENTION

Figure 1:
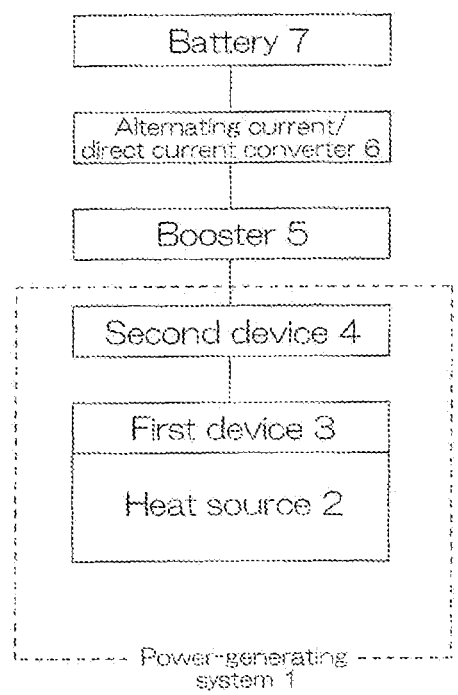
FIG. 1 is a schematic diagram illustrating the configuration of an embodiment of a power-generating system of the present invention.

FIG. 1 is a schematic diagram illustrating the configuration of an embodiment of the power-generating system of the present invention.

In FIG. 1, a power-generating system 1 includes a heat source 2 having a temperature that goes up and down over time; a first device 3 that undergoes electric polarization due to a temperature change of the heat source 2; and a second device 4 that takes out an electric power from the first device 3.

The heat source 2 is not particularly limited, as long as the heat source has a temperature that goes up and down over time, and examples thereof include various energy-using devices such as internal combustion engines, and luminous devices.

The internal combustion engine is, for example, a device that outputs motive power for vehicles. For example, a single cylinder or a multicylinder type is used, and in the single cylinder or multicylinder, a multi-stroke cycle (e.g., two-stroke cycle, four-stroke cycle, and six-stroke cycle, etc.) is used.

In such an internal combustion engine, pistons repeatedly move up and down in the cylinders, and such up-down moves of the pistons allow, for example, in the four-stroke cycle system, performance of an intake stroke, a compression stroke, a power stroke, and an exhaust stroke sequentially, and combustion of fuel, to output motive power.

In such an internal combustion engine, in the exhaust stroke, a high temperature exhaust gas is discharged via the exhaust gas pipe. At that time, the exhaust gas pipe receives the heat energy of the exhaust gas, increasing the temperature.

Meanwhile, in other strokes (strokes excluding the exhaust stroke), the exhaust gas amount in the exhaust gas pipe decreases, and therefore the heat energy received by the exhaust gas pipe decreases. As a result, the temperature of the exhaust gas pipe decreases.

Thus, the temperature of the internal combustion engine increases in the exhaust stroke, decreases in the intake stroke, compression stroke, and power stroke: that is, the temperature goes up and down over time.

In particular, the above-described strokes are repeated periodically and sequentially in accordance with the piston cycle, and therefore the temperature of the exhaust gas pipes of the cylinders of the internal combustion engine changes periodically in accordance with the cycle of the repetition of the above-described strokes, to be more specific, a high-temperature state and a low temperature state are repeated periodically.

The temperature of the luminous device increases when the luminous device is turned on (emission), for example, by heat energy of light such as infrared radiation and visible light, while when the luminous device is turned off, its temperature decreases. Thus, the temperature of the luminous devices goes up and down over time when turned on (emission) or off.

In particular, for example, when the luminous device is a luminous device that repeats turning on and off of light over time intermittently (blinking (switching) luminous device), the temperature of the luminous device changes periodically by heat energy of light at the time when turned on (emission), to be more specific, a high-temperature state and a low temperature state are repeated periodically.

Examples of the heat source 2 further include a plurality of heat sources, and a temperature change can also be caused by switching between the plurality of heat sources.

To be more specific, for example, in an embodiment, the heat source includes two heat sources, i.e., a low temperature heat source (coolant, etc.) and a high temperature heat source (e.g., heating material, etc.) having a temperature higher than the low temperature heat source; and the low temperature heat source and the high temperature heat source are switched back and forth alternately over time.

In this manner, the temperature of the heat source can be increased or decreased over time, and in particular, by repeating the switching back and forth between the low temperature heat source and the high temperature heat source periodically, the periodic temperature change can be achieved.

The heat source 2 including a plurality of switchable heat sources is not particularly limited, and examples thereof include a high temperature air furnace (e.g., a high-temperature gas generator described in WO96-05474) including a combustion low temperature air supplier, a regenerator heat exchanger, a high temperature gas exhauster, and a supply/exhaust switch valve; and a seawater exchange system (hydrogen storage alloy actuator seawater exchange system) using a high temperature heat source, a low temperature heat source, and a hydrogen storage alloy.

As the heat source 2, the above-described heat sources may be used singly or in combination of two or more.

As the heat source 2, preferably, a heat source that undergoes a periodic temperature change over time is used.

As the heat source 2, preferably, an internal combustion engine is used.

The first device 3 is a device that undergoes electric polarization in accordance with the temperature change of the heat source 2.

The electric polarization here is defined as the following: a phenomenon of electromotive force occurrence when a temperature difference is generated at both ends of a material, including, for example, a phenomenon of occurrence of a potential difference by dielectric polarization due to displacement of plus and minus ions based on the deformation of a crystal, such as the piezoelectric effect; and/or a phenomenon of occurrence of a potential difference by changes in the dielectric constant due to a temperature change, such as the pyroelectric effect; and/or a phenomenon of occurrence of a potential difference by partial electric charge due to a temperature change or a temperature gradient, such as the Seebeck effect.

Examples of the first device 3 include, to be more specific, a device that undergoes electric polarization by the pyroelectric effect, a device that undergoes electric polarization by the Seebeck effect, and a device that undergoes electric polarization by the piezoelectric effect.

The pyroelectric effect is, for example, the effects (phenomenon) such as the following: when an insulator (dielectric) is heated or cooled, the insulator undergoes electric polarization in accordance with the temperature change. The pyroelectric effect includes a first effect and a second effect.

In the first effect, at the time of heating or cooling of the insulator, spontaneous polarization occurs by the temperature change, and an electric charge is generated on the insulator surface.

In the second effect, at the time of heating or cooling of the insulator, pressure deflection is caused in the crystal structure by the temperature change, and the pressure or the deformation on the crystal structure causes piezoelectric polarization (piezoelectric effect).

Such a device that undergoes electric polarization by the pyroelectric effect is not particularly limited, and a known pyroelectric element may be used.

When a pyroelectric element is used as the first device 3, the pyroelectric element is disposed, for example, in the proximity of the heat source 2, or so as to be in contact with the heat source 2 with an electrode to be described later interposed therebetween.

In such a case, the pyroelectric element is heated or cooled by temperature changes over time of the heat source 2, and undergoes electric polarization by its pyroelectric effect (including the first effect and second effect). In this manner, although to be described later, an electric power is taken out from the pyroelectric element via the second device 4.

In such a pyroelectric element, usually, a heated state or a cooled state is kept, and when its temperature becomes constant, the electric polarization is neutralized, and by cooling or heating thereafter, the pyroelectric element undergoes electric polarization again.

Thus, as described above, when the temperature of the heat source 2 changes periodically, and a high-temperature state and a low temperature state are periodically repeated, the pyroelectric element is heated and cooled periodically and repeatedly, and therefore the electric polarization and neutralization of the pyroelectric element are periodically repeated.

As a result, an electric power can be taken out as a periodically changing waveform (e.g., alternating current, pulsating current, etc.) by the second device 4 to be described later.

The Seebeck effect is, for example, the effect (phenomenon) such as the following: when a temperature difference is generated at both ends of a metal or a semiconductor, an electromotive force is generated in the metal or the semiconductor in accordance with the temperature difference.

The device that undergoes electric polarization by the Seebeck effect is not particularly limited, and a known thermoelectric element may be used.

When a thermoelectric element is used as the first device 3, the thermoelectric element is disposed, for example, so that one end portion thereof is brought in the proximity of the heat source 2, or into contact with the heat source 2 with the electrode to be described later interposed therebetween, and the other end portion thereof is distant from the heat source 2.

In this case, only one end portion of the thermoelectric element is heated or cooled by the temperature change over time of the heat source 2, and a temperature difference is caused between the both ends (between one end portion and the other end portion thereof) of the thermoelectric element. At this time, an electromotive force is generated in the thermoelectric element by the Seebeck effect. In this manner, although to be described later, an electric power is taken out from the thermoelectric element via the second device 4.

In such a thermoelectric element, when the temperature difference between the both ends is large, the electromotive force is high, which allows obtainment of a high electric power. On the other hand, when the temperature difference is small, the electromotive force is small, which decreases the electric power to be taken out.

Thus, as described above, when the temperature of the heat source 2 changes periodically, and a high-temperature state and a low temperature state are periodically repeated, the temperature of the one end portion of the thermoelectric element increases or decreases repeatedly and periodically, and therefore the degree of the electromotive force increases or decreases periodically in accordance with the temperature change.

As a result, an electric power is taken out as a periodically changing waveform (e.g., alternating current, pulsating current, etc.) by the second device 4 to be described later.

In the piezoelectric effect (phenomenon), electric polarization is caused when a pressure or a deformation is applied in accordance with the degree of the pressure or the deformation.

The first device 3 that undergoes electric polarization by the piezoelectric effect is not particularly limited, and a thin, or bulk known piezoelectric element may be used.

When a piezoelectric element is used as the first device 3, the piezoelectric element is disposed, for example, so that the piezoelectric element is brought in the proximity of the heat source 2, or into contact with the heat source 2 to be described later with the electrode interposed therebetween while the surrounding thereof is fixed by a fixing member to suppress the volume expansion thereof. The fixing member is not particularly limited, and for example, the second device 4 (e.g., electrode, etc.) to be described later may also be used.

In this case, the piezoelectric element is heated or cooled by the temperature change over time of the heat source 2, which allows expansion or shrinkage thereof.

In such a case, the volume expansion of the piezoelectric element is suppressed by the fixing member, and therefore the piezoelectric element is pressed by the fixing member, which allows electric polarization to occur by the piezoelectric effect (piezoelectric effect). In this manner, although to be described later, an electric power is taken out from the thermoelectric element via the second device 4.

In such a piezoelectric element, usually, a heated state or a cooled state is kept, and when its temperature becomes constant (that is, the volume is constant), the electric polarization is neutralized, and by cooling or heating thereafter, the piezoelectric element undergoes electric polarization again.

Thus, as described above, when the temperature of the heat source 2 changes periodically, and a high-temperature state and a low temperature state are periodically repeated, the piezoelectric element is heated and cooled repeatedly and periodically, and therefore electric polarization and neutralization of the piezoelectric element are periodically repeated.

As a result, an electric power can be taken out as a periodically changing waveform (e.g., alternating current, pulsating current, etc.) by the second device 4 to be described later.

These first devices 3 may be used singly or in combination of two or more.

Figure 2:
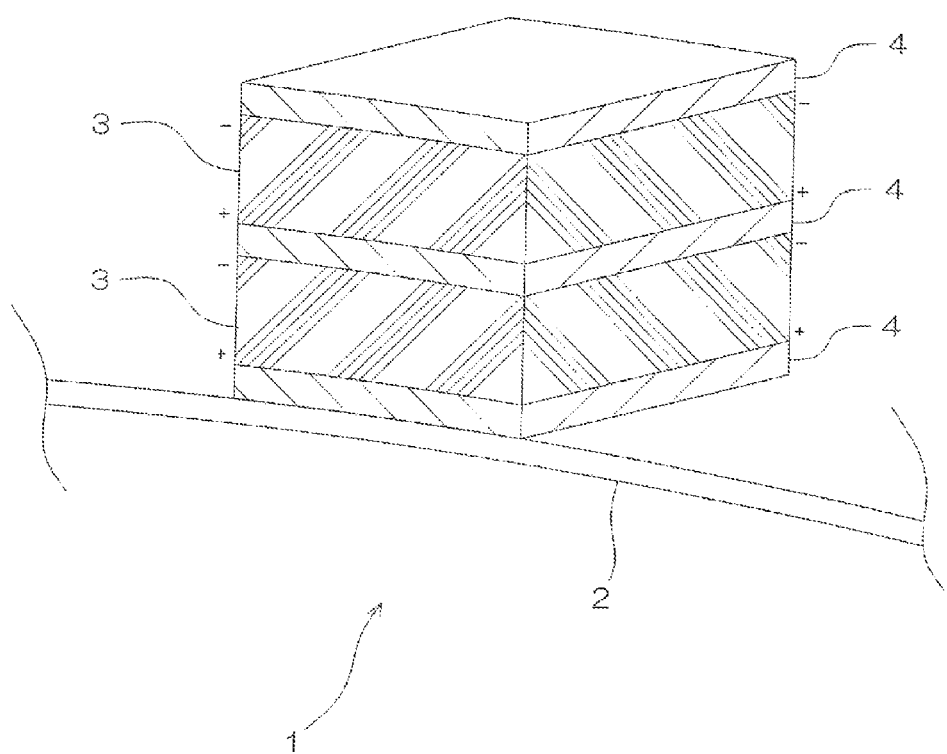
FIG. 2 is a schematic diagram illustrating the configuration of an embodiment of a first device shown in FIG. 1.

FIG. 2 is a schematic diagram illustrating the configuration of an embodiment of the first device shown in FIG. 1.

The above-described first device 3 can also be used, as shown in FIG. 2, for example, in a stack.

In this case, the second devices 4 (e.g., electrode, lead wire, etc.) to be described later are interposed between the plurality of first devices 3 (preferably, pyroelectric element), thus connecting the first devices 3 electrically in series at the time of electric polarization.

Then, the thus obtained stack of the first devices 3 is disposed, as shown in FIG. 1, so as to be in contact with or in the proximity of the heat source 2, and the stacked first devices 3 are simultaneously heated or cooled.

Electric polarization is caused simultaneously in the plurality of first devices 3 and electrical connection in series is allowed in this manner, and as a result, compared with the case where the first device 3 is used singly (as a single layer), a large electric power can be taken out.

FIG. 3 is a schematic diagram illustrating the configuration of another embodiment of the first device shown in FIG. 1.

The above-described first device 3 can also be used, as shown in FIG. 3, for example, by arranging the first devices 3 in line on the same plane.

In this case, the second devices 4 (e.g., electrode, lead wire, etc.) to be described later are provided between the plurality of first devices 3, thus connecting the first devices 3 electrically in series at the time of electric polarization.

Then, the plurality of first devices 3 thus arranged in line are disposed, as shown in FIG. 1, so as to be in contact with or in the proximity of the heat source 2, and all of the first devices 3 arranged in line are heated or cooled simultaneously.

Electric polarization is caused simultaneously in the plurality of first devices 3 and electrical connection in series is allowed in this manner, and as a result, compared with the case where the first device 3 is used singly, a large electric power can be taken out.

At that time, for example, when the first device 3 is a pyroelectric element, or when only a thermoelectric element composed of p-type semiconductor or a thermoelectric element composed of n-semiconductor is used, in the first devices 3, electric polarization occurs so that one side that is in contact with or in the proximity of the heat source 2 is all positive electrodes or negative electrodes, and the other side that is distant from the heat source 2 is all negative electrodes or positive electrodes (ref: FIG. 3 (*a*)).

Therefore, in such a case, the side making contact with or in the proximity of the heat source 2 in one first device 3 is electrically connected with the side distant from the heat source 2 in another first device 3.

On the other hand, when a thermoelectric element composed of p-type semiconductor, and a thermoelectric element composed of n-semiconductor are used as the first device 3, and these are disposed alternately, electric polarization occurs oppositely in the thermoelectric element composed of p-type semiconductor and the thermoelectric element composed of n-semiconductor, and therefore at one side of the first devices 3 that is brought into contact with or in the proximity of the heat source 2, a positive electrode and a negative electrode are alternately arranged in line.

Thus, in such a case, the side making contact with or in the proximity of the heat source 2 in one first device 3 is electrically connected with the side making contact with or in the proximity of the heat source 2 in another first device 3, and the side distant from the heat source 2 in one first device 3 is electrically connected with the side distant from the heat source 2 of another first device 3 (ref: FIG. 3 (*b*)).

In FIG. 1, the second device 4 is provided so as to take out an electric power from the first device 3.

Such a second device 4 is not particularly limited, and includes, for example, two electrodes (e.g., copper electrode, silver electrode, etc.) that are disposed to face each other with the above-described first device 3 sandwiched therebetween, and lead wires to be connected to these electrodes; and is electrically connected to the first device 3.

In a power-generating system 1 shown in FIG. 1, the second device 4 is electrically connected to, in sequence, a booster 5, an alternating current/direct current converter (AC-DC converter) 6, and a battery 7.

To generate electricity by such a power-generating system 1, for example, first, the temperature of the heat source 2 is increased or decreased over time; preferably, the temperature is changed periodically to cause electric polarization preferably periodically in the above-described first device 3 in accordance with the temperature change. Thereafter, through the second device 4, an electric power is taken out as a periodically changing waveform (e.g., alternating current, pulsating current, etc.) in accordance with the periodical electric polarization of the first device 3.

In such a power-generating system 1, the temperature of the heat source 2 is, in a high-temperature state, for example, 500 to 1200° C., preferably 700 to 900° C.; in a low temperature state, below the temperature of the above-described high-temperature state, to be more specific, for example, 200 to 800° C., preferably 200 to 500° C.; and the temperature difference between the high-temperature state and the low temperature state is, for example, 10 to 600° C., preferably 20 to 500° C.

The repetition cycle of the high-temperature state and low temperature state is, for example, 10 to 400 cycle/sec, preferably 30 to 100 cycle/sec.

The electric power thus taken out from the power-generating system 1 is boosted in the booster 5 connected to the second device 4, as in a state of a periodically changing waveform (e.g., alternating current, pulsating current, etc.). For the booster 5, a booster that is capable of boosting the alternating current voltage with excellent efficiency with a simple structure using, for example, a coil, condenser, etc is used.

Then, the electric power with its pressure boosted by the booster 5 is converted to a direct current voltage in the alternating current/direct current converter 6, and thereafter, stored in the battery 7.

With such a power-generating system 1, the heat source 2 having a temperature that goes up and down over time is used, and therefore a changing voltage (e.g., alternating current voltage) can be taken out, and as a result, compared with the case where a constant voltage (direct current voltage) is taken out, electric power can be stored with a simple structure and excellent boosting efficiency.

Furthermore, when the heat source 2 is a heat source undergoes a periodic temperature change, the electric power can be taken out as a periodically changing waveform, and as a result, the electric power can be stored with a simple structure and excellent boosting efficiency.

Figure 4:
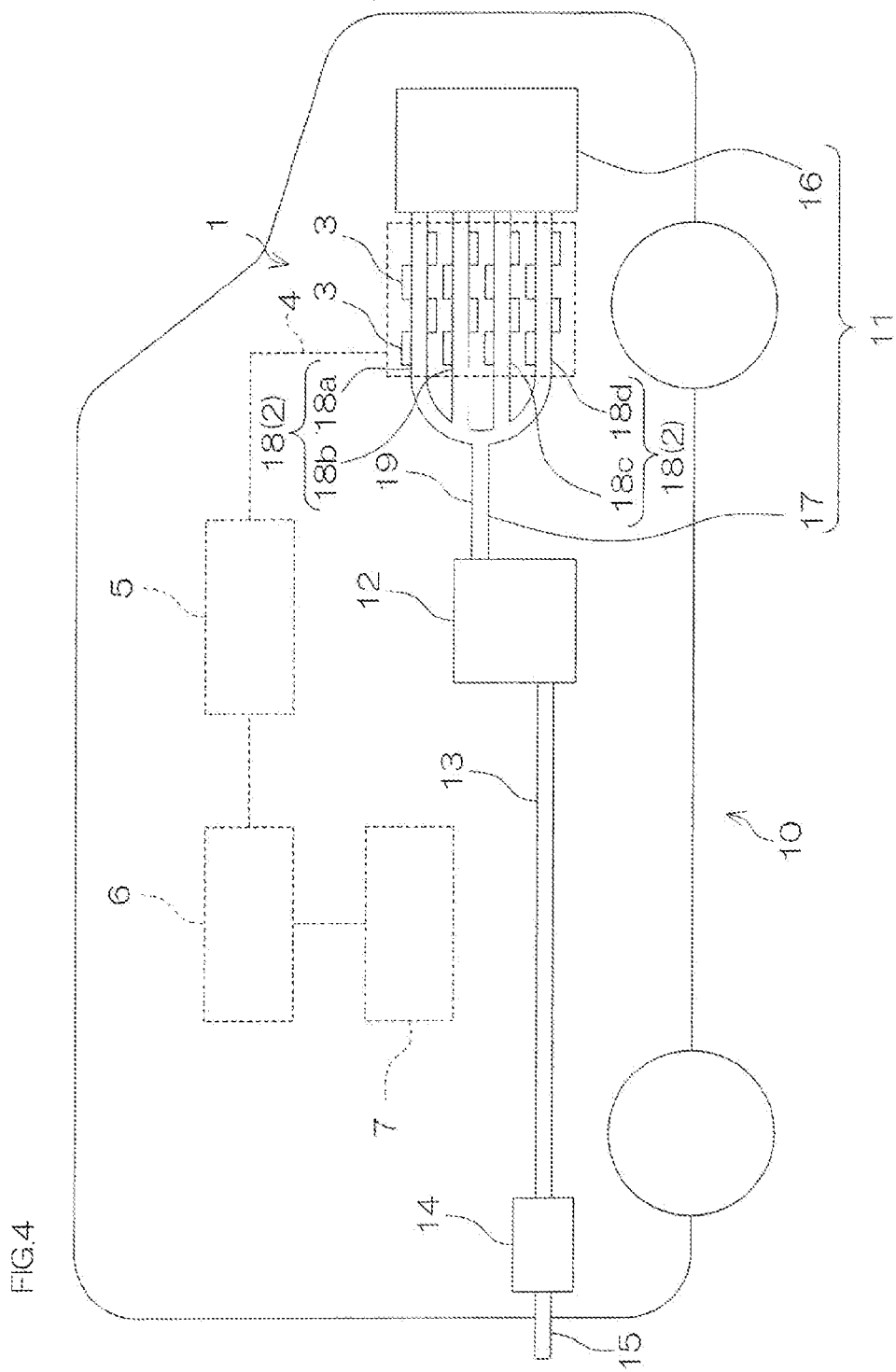
FIG. 4 is a schematic diagram illustrating the configuration of an embodiment of the power-generating system of the present invention on board.

FIG. 4 is a schematic diagram illustrating the configuration of an embodiment, in which a power-generating system of the present invention is on board.

In FIG. 4, an automobile 10 includes an internal combustion engine 11, a catalyst mount portion 12, an exhaust pipe 13, a muffler 14, and an outlet pipe 15.

The internal combustion engine 11 includes an engine 16, and an exhaust manifold 17.

The engine 16 is a four cylinder, four-stroke cycle engine, and an upstream end portions of branch pipes 18 (described later) of the exhaust manifold 17 are connected to the cylinders.

The exhaust manifold 17 is provided for collecting the exhaust gas discharged from the cylinders of the engine 16; and includes a plurality of (four) branch pipes 18 (when these have to be distinguished, these are referred to as, from the top in FIG. 4, a branch pipe 18a, a branch pipe 18b, a branch pipe 18c, and a branch pipe 18d.) connected to the cylinders of the engine 16, and a collection pipe 19 that integrates the branch pipes 18 at a downstream side of the branch pipe 18.

In such an exhaust manifold 17, the upstream end portions of the branch pipes 18 are connected to the cylinders of the engine 16, and the downstream end portions of the branch pipe 18 are connected to the upstream end portion of the collection pipe 19. The downstream end portion of the collection pipe 19 is connected to the upstream end portion of the catalyst mount portion 12.

The catalyst mount portion 12 includes, for example, a catalyst carrier and a catalyst coated thereon, and is connected to the downstream end portion of the internal combustion engine 11 (exhaust manifold 17) to purify toxic components such as hydrocarbon (HC), nitrogen oxide ($NO_x$), carbon monoxide (CO) contained in the exhaust gas discharged from the internal combustion engine 11.

The exhaust pipe 13 is provided for guiding the exhaust gas purified at the catalyst mount portion 12 to the muffler 14, and the upstream end portion thereof is connected to the catalyst mount portion 12, and the downstream end portion thereof is connected to the muffler 14.

The muffler 14 is provided to reduce the noise generated in the engine 16 (in particular, power stroke), and the upstream end portion thereof is connected to the downstream end portion of the exhaust pipe 13. The downstream end portion of the muffler 14 is connected to the upstream end portion of the outlet pipe 15.

The outlet pipe 15 is provided for releasing, into the air, the exhaust gas that was discharged from the engine 16, and was purified, with its noise reduced passing through the exhaust manifold 17, the catalyst mount portion 12, the exhaust pipe 13, and the muffler 14 sequentially. The upstream end portion of the outlet pipe 15 is connected to the downstream end portion of the muffler 14, and the downstream end portion of the outlet pipe 15 is open into the air.

The automobile 10 is equipped with, as shown by the dotted line in FIG. 4, the power-generating system 1.

Figure 5:
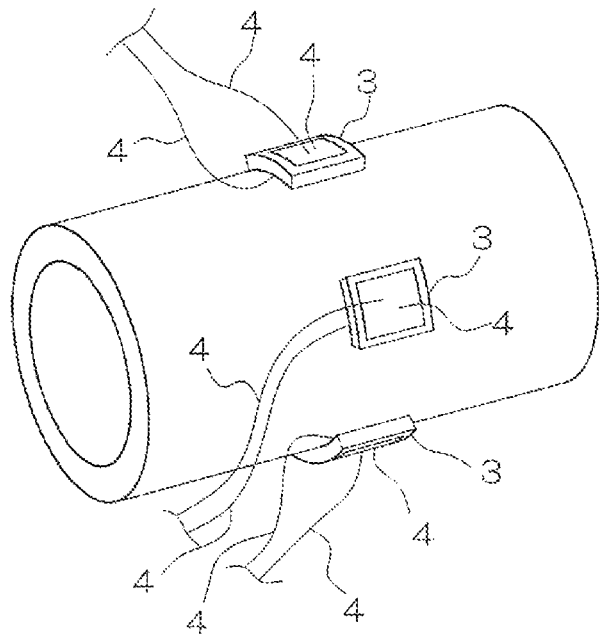
FIG. 5 is an enlarged view of a relevant part of the power-generating system shown in FIG. 4.

FIG. 5 is an enlarged view of a relevant part of the power-generating system shown in FIG. 4.

In FIG. 5, the power-generating system 1 includes, as described above, the heat source 2, the first device 3, and the second device 4.

In the power-generating system 1, the branch pipe 18 of the exhaust manifold 17 in the internal combustion engine 11 is used as the heat source 2, and the first device 3 is disposed around the branch pipe 18.

Examples of the first device 3 that may be used are, as described above, a known pyroelectric element (e.g., $BaTiO_3$, $CaTiO_3$, $(CaBi)TiO_3$, $BaNd_2Ti_5O_{14}$, $BaSm_2Ti_4O_{12}$, lead zirconate titanate (PZT: $Pb(Zr,Ti)O_3$), etc.), a known thermoelectric element (e.g., Bi—Te thermoelectric element (e.g., $Bi_2Te_3$, $Bi_2Te_3/Sb_2Te_3$, etc.)), PbTe, $AgSbTe_2/GeTe$, $NaCo_2O_4$, $CaCoO_3$, $SrTiO_3/SrTiO_3$: Nb, SiGe, $\beta$-$FeSi_2$, $Ba_8Si_{46}$, $Mg_2Si$, $MnSi_{1.73}$, ZnSb, $Zn_4Sb_3$, $CeFe_3CoSb_{12}$, $LaFe_3CoSb_{12}$, $SrTiO_3/SrTiO_3$: $Nb/SrTiO_3$, Si nanowire array, $NaCo_2O_4$, $(Ce_{1-x}La_x)Ni_2$, $(Ce_{1-x}La_x)In_3$, $CeInCu_2$, $NaV_2O_5$, $V_2O_5$, etc.), and a known piezoelectric element (e.g., crystal ($SiO_2$), zinc oxide (ZnO), Rochelle salt (potassium sodium tartrate) ($KNaC_4H_4O_6$), lead zirconate titanate (PZT: $Pb(Zr,Ti)O_3$), lithium niobate ($LiNbO_3$), lithium tantalate ($LiTaO_3$), lithium tetraborate ($Li_2B_4O_7$), langasite ($La_3Ga_5SiO_{14}$), aluminum nitride (AlN), tourmaline, polyvinylidene fluoride (PVDF), etc.).

When the first device 3 is a pyroelectric element and/or piezoelectric element (insulator (dielectric)), the Curie point is, for example, −77° C. or more, preferably −10° C. or more, and for example, 1300° C. or less, preferably 900° C. or less.

The relative dielectric constant of the first device 3 (insulator (dielectric)) is, for example, 1 or more, preferably 100 or more, and even more preferably 2000 or more.

In such a power-generating system 1, higher the relative dielectric constant of the first device 3 (insulator (dielectric)) is, the higher the energy conversion efficiency is, which allows for obtainment of an electric power at high voltage. However, when the relative dielectric constant of the first device 3 is below the above-described lower limit, the energy conversion efficiency is low, and the voltage of the obtained electric power may be low.

In the first device 3 (insulator (dielectric)), electric polarization occurs by the temperature change of the heat source 2, and the electric polarization may be any of electronic polarization, ionic polarization, and orientation polarization.

For example, it has been expected that with those materials in which polarization occurs by orientation polarization (e.g., liquid crystal material, etc.), improvement in power generation efficiency can be achieved by changing its molecule structure.

When the first device 3 is a thermoelectric element, its performance is represented, for example, by the following formula (I).

$$ZT=S^2\sigma T/\kappa \qquad (1)$$

(where Z represents figure of merit, T represents the absolute temperature, S represents the Seebeck coefficient, σ represents electric conductivity, and κ represents thermal conductivity.)

In the first device 3 (thermoelectric element), the ZT value (dimensionless figure of merit) is, for example, 0.3 or more.

When the ZT value (dimensionless figure of merit) is below the above-described lower limit, the energy conversion efficiency is low, and the voltage of the obtained electric power may be low.

Furthermore, because the thermoelectric element usually generates electricity based on the temperature difference inside the material, the lower the thermal conductivity of the thermoelectric element is, the higher the energy conversion efficiency is. However, in this power-generating system 1, the temperature difference at the both ends of the first device 3 (thermoelectric element) is not necessary, and therefore the thermal conductivity of the first device 3 (thermoelectric element) is not particularly limited.

The second device 4 includes two electrodes that are disposed to face each other with the first device 3 sandwiched therebetween, and lead wires connected to these electrode. The electrode and the lead wire that are disposed at one side surface of the first device 3 are disposed so as to be interposed between the first device 3 and the branch pipe 18 (heat source 2), and the electrode and the lead wire that are disposed at the other side surface of the first device 3 are exposed without making contact with the branch pipe 18 (heat source 2).

As shown in FIG. 4, the power-generating system 1 is electrically connected, in sequence, to the booster 5, the alternating current/direct current converter 6, and the battery 7.

In such an automobile 10, the engine 16 is driven by repetitive up-down motion of pistons in cylinders, performing the intake stroke, the compression stroke, the power stroke, and the exhaust stroke in sequence.

To be more specific, for example, in the two cylinders of the cylinder connected to the branch pipe 18*a* and the cylinder connected to the branch pipe 18*c*, the pistons work together to conduct the intake stroke, the compression stroke, the power stroke, and the exhaust stroke synchronously. This allows fuel combustion and output of motive power, allowing a high temperature exhaust gas to pass through inside of the branch pipe 18*a* and the branch pipe 18*c* in the exhaust stroke.

At this time, the temperature of the branch pipe 18*a* and the branch pipe 18*c* increases in the exhaust stroke, and decreases in other strokes (intake stroke, compression stroke, and power stroke), and therefore increases and decreases over time in accordance with the piston cycle, thus repeating a high-temperature state and a low temperature state periodically.

On the other hand, at different timing from these two cylinders, in the two cylinders of the cylinder connected to the branch pipe 18*b* and the cylinder connected to the branch pipe 18*d*, pistons work together to conduct the intake stroke, the compression stroke, the power stroke, and the exhaust stroke synchronously. This allows fuel combustion and output of motive power at different timing from the branch pipe 18*a* and the branch pipe 18*c*, allowing a high temperature exhaust gas to pass through inside of the branch pipe 18*b* and the branch pipe 18*d* in the exhaust stroke.

At this time, the temperature of the branch pipe 18*b* and the branch pipe 18*d* increases in the exhaust stroke, and decreases in other strokes (intake stroke, compression stroke, and power stroke), and therefore increases and decreases over time in accordance with the piston cycle, thus repeating a high-temperature state and a low temperature state periodically.

The periodic temperature change occurs at the same period, but at a different phase from the periodic temperature change of the branch pipe 18*a* and the branch pipe 18*c*.

In the power-generating system 1, the first device 3 is disposed at every branch pipe 18 (heat source 2).

Thus, a periodic high-temperature state or low temperature state can be caused in the first device 3 based on the temperature change over time of the branch pipe 18 (heat source 2), and electric polarization can be caused in the first device 3 in accordance with the effects (e.g., pyroelectric effect, Seebeck effect, piezoelectric effect, etc.) of the element (e.g., pyroelectric element, thermoelectric element, piezoelectric element, etc.).

Thus, in the power-generating system 1, an electric power can be taken out from the first devices 3 via the second devices 4 as a periodically changing waveform (e.g., alternating current, pulsating current, etc.).

Furthermore, in the power-generating system 1, the temperature of the branch pipe 18*a* and the branch pipe 18*c*, and the temperature of the branch pipe 18*b* and the branch pipe 18*d* change at the same period, but at a different phase periodically, and therefore an electric power can be taken out continuously as a periodically changing waveform (e.g., alternating current, pulsating current, etc.).

Then, the exhaust gas passes through the branch pipes 18, and then is supplied to the collection pipe 19. After the collection, the exhaust gas is supplied to the catalyst mount portion 12, and is purified by the catalyst provided in the catalyst mount portion 12. Thereafter, the exhaust gas is supplied to the exhaust pipe 13, and after the noise is reduced in the muffler 14, the exhaust gas is discharged outside through the outlet pipe 15.

At this time, the exhaust gas that passes through the branch pipes 18 is collected in the collection pipe 19, and therefore the temperature of the exhaust gas that passes through the collection pipe 19, the catalyst mount portion 12, the exhaust pipe 13, the muffler 14, and the outlet pipe 15 in sequence is smoothed.

Thus, the temperature of the collection pipe 19, the catalyst mount portion 12, the exhaust pipe 13, the muffler 14, and the outlet pipe 15, which allows the exhaust gas with its temperature smoothed to pass through usually does not go up and down over time, keeping a substantially constant temperature.

Therefore, when the collection pipe 19, the catalyst mount portion 12, the exhaust pipe 13, the muffler 14, or the outlet pipe 15 is used as the heat source 2, and the above-described first devices 3 are disposed at the surrounding thereof with the second device 4 interposed therebetween, the voltage of the electric power taken out from the first device 3 is small, and also is constant (direct current voltage).

Thus, in such a method, the pressure of the obtained electric power cannot be increased with a simple structure, which is disadvantageous in that storage of electricity is inefficient.

On the other hand, as described above, in the power-generating system 1 in which the internal combustion engine 11 (branch pipe 18) is used as the heat source 2, a periodic high-temperature state or low temperature state is allowed in the first device 3 based on the temperature change over time of the heat source 2, and periodic electric polarization can be caused in the first device 3 in accordance with the effects (e.g., pyroelectric effect, Seebeck effect, piezoelectric effect, etc.) of the device (e.g., pyroelectric element, thermoelectric element, piezoelectric element, etc.).

Thus, in the power-generating system 1, an electric power can be taken out via the second device 4 from the first devices 3 as a periodically changing waveform (e.g., alternating current, pulsating current, etc.).

Thereafter, in this method, for example, as shown by the dotted line in FIG. 4, the voltage of the electric power obtained as described above is increased in the booster 5 connected to the second device 4 under the state of a periodically changing waveform (e.g., alternating current, pulsating current, etc.), and then after the electric power with its voltage boosted is converted to a direct current voltage in an alternating current/direct current converter 6, the electric power is stored in the battery 7. The electric power stored in the battery 7 is used suitably as a motive power for the automobile 10, or for various electrical accessories mounted in the automobile 10.

In such a power-generating system 1, the heat source 2 with its temperature goes up and down over time is used, and therefore a changing voltage (e.g., alternating current voltage) can be taken out, and as a result, compared with the case where a constant voltage (direct current voltage) is taken out, the pressure can be increased and electricity can be stored with excellent efficiency with a simple structure.

Although not shown in detail, in application, the first device 3 can be stacked, as shown in FIG. 2, and furthermore, as shown in FIG. 3, the first device 3 can also be arranged in line on the same plane depending on the types, necessity, and application.

When the first device 3 is stacked and/or arranged in line on the same plane in its application, electric polarization can be caused in a plurality of first devices 3 simultaneously, and the first devices 3 can be electrically connected in series, and as a result, a large electric power can be taken out compared with the case where the first device 3 is used singly.

Although the first devices 3 are disposed at the surrounding (outer wall) of the branch pipe 18 in the above description, the first devices 3 are preferably disposed inside the branch pipe 18 (e.g., inner wall) to conduct the temperature change to the first device 3 without averaging the temperature change.

EXAMPLES

While in the following, the present invention is described with reference to Examples, the present invention is not limited to any of them by no means.

Example 1

Pyroelectric Effect

Figure 6:
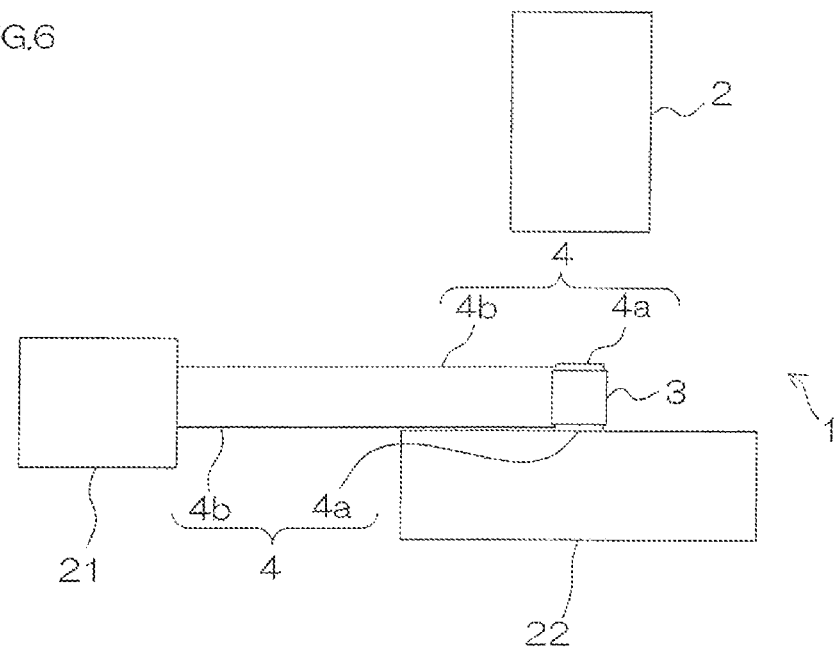
FIG. 6 is a schematic diagram illustrating the configuration of a power-generating system used in Example 1.

FIG. 6 is a schematic diagram illustrating the configuration of the power-generating system used in Example 1.

A pyroelectric element (product number: WG197, calcium titanate ($CaTiO_3$) (containing a trace amount of Bi), crystal structure: perovskite type, relative dielectric constant: 197, electrostatic capacity: 0.75 nF, size: 25 mm×25 mm×1.3 mm, manufactured by Nippon Tungsten Co., Ltd.) was used as the first device 3, and a silver paste was applied on the front face and the reverse face so that the size was 20 mm×20 mm×0.1 mm Thereafter, heating was conducted at a temperature increase rate of 10° C./min from 0° C. to 120° C., and after the temperature was kept at 120° C. for 1 hour, heating was continued at a temperature increase rate of 10° C./min until 500° C. The temperature was kept at 500° C. for 1 hour. Thereafter, cooling was conducted at a temperature decrease rate of 10° C./min until normal temperature, thereby forming silver electrodes as the second device 4a on both sides of the pyroelectric element.

Thereafter, the pyroelectric element including the silver electrodes was mounted on a metal-made pipe 22, and the silver electrode and a digital multimeter 21 were connected via a lead wire of the second device 4b.

A dryer (jet air temperature: 250 to 300° C.) was used as the heat source 2. The dryer and pyroelectric element were positioned so that the jet of the dryer was directed at the pyroelectric element, and the jet was distant from the pyroelectric element by 1 cm.

By blowing hot air from the dryer, and switching ON/OFF the dryer over time, the temperature was allowed to go up and down over time. This temperature change caused electric polarization in the pyroelectric element, and the generated voltage (electric power) was taken out via the electrode and the lead wire.

The temperature change of the pyroelectric element based on the dryer was observed, and the changes in the voltage of the electric power taken out from the pyroelectric element were observed with the digital multimeter 21.

Figure 7:
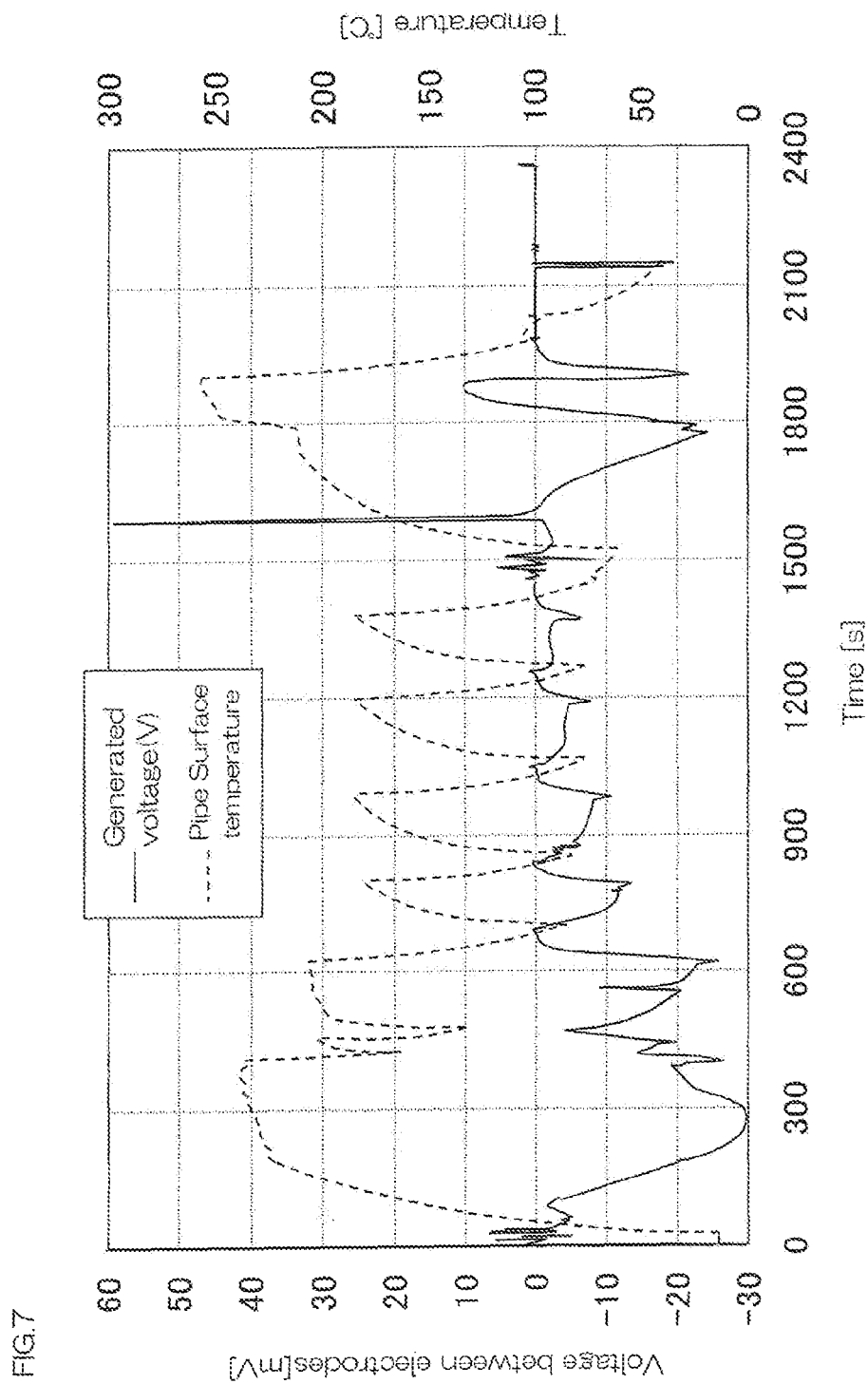
FIG. 7 is a graph illustrating relationship between the generated voltage and the temperature change obtained in Example 1.

For the temperature change of the pyroelectric element, the temperature of the pipe with which the pyroelectric element was in contact was measured as an approximate value. The relationship between the generated voltage and the temperature change is shown in FIG. 7.

Example 2

Seebeck Effect

Figure 8:
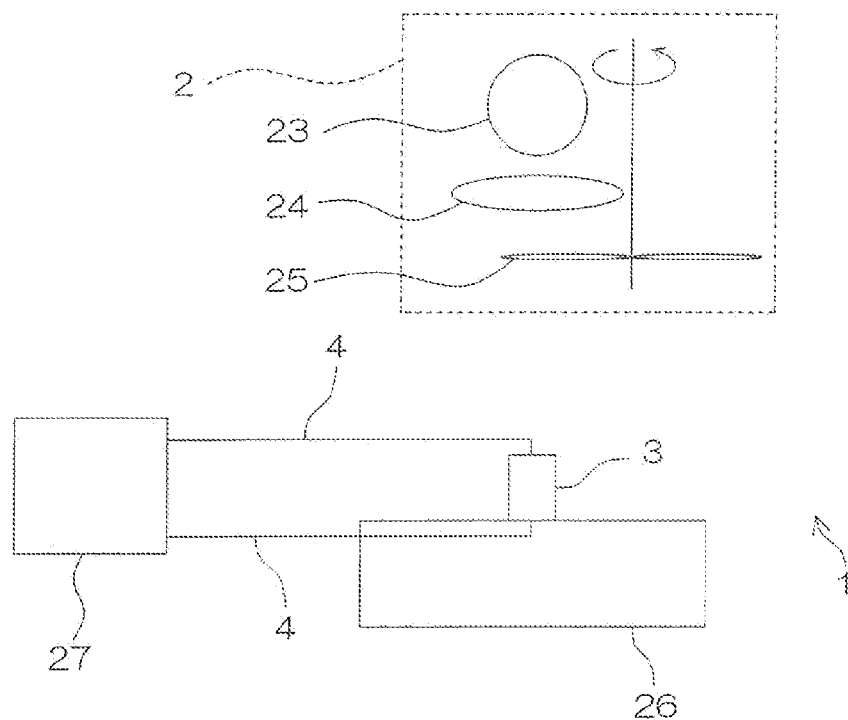
FIG. 8 is a schematic diagram illustrating the configuration of a power-generating system used in Example 2.

FIG. 8 is a schematic diagram illustrating the configuration of a power-generating system used in Example 2.

A thermoelectric element (product number: KSEH02031Z-ABE, Bi—Te thermo module, metallize: CuNiAu, size: 8 mm×8 mm×1.5 mm (composed of 62 thermoelectric materials of about 0.8 mm×0.8 mm×1 mm), manufactured by KELK Ltd.) was used as the first device 3.

Carbon (not shown) was applied on one side surface of the thermoelectric element (metallized) to allow light absorption, and the thermoelectric element was placed so that the other side end face of the thermoelectric element was brought into contact with a water-cooling plate 26 having a temperature of 20° C. The lead wire connected to the thermoelectric element and an oscilloscope 27 were connected via the lead wire of the second device 4.

A solar simulator 23 (light source: metal halide lamp, 1000 $W/m^2$), a condenser lens 24, and a rotor blade chopper 25 were used as the heat source 2, and while the light of the solar simulator 23 was condensed by the condenser lens 24, the chopper 25 was rotated to block the light periodically, thereby producing intermittent light.

The solar simulator 23 and the thermoelectric element were positioned so that the light source of the solar simulator 23 was distant from the thermoelectric element by 60 cm.

While keeping the temperature at the other side surface was kept at 20° C. by the water-cooling plate 26, the chopping frequency of the chopper 25 was set to 0.12 Hz, and the temperature of the one side surface of the thermoelectric element was allowed to change periodically based on the heat energy of the intermittent light.

Based on the temperature change of the one side surface of the thermoelectric element, and on the temperature difference between the one side surface and the other side surface, electric polarization was caused in the thermoelectric element, and electric power was taken out via the lead wire.

Figure 9:
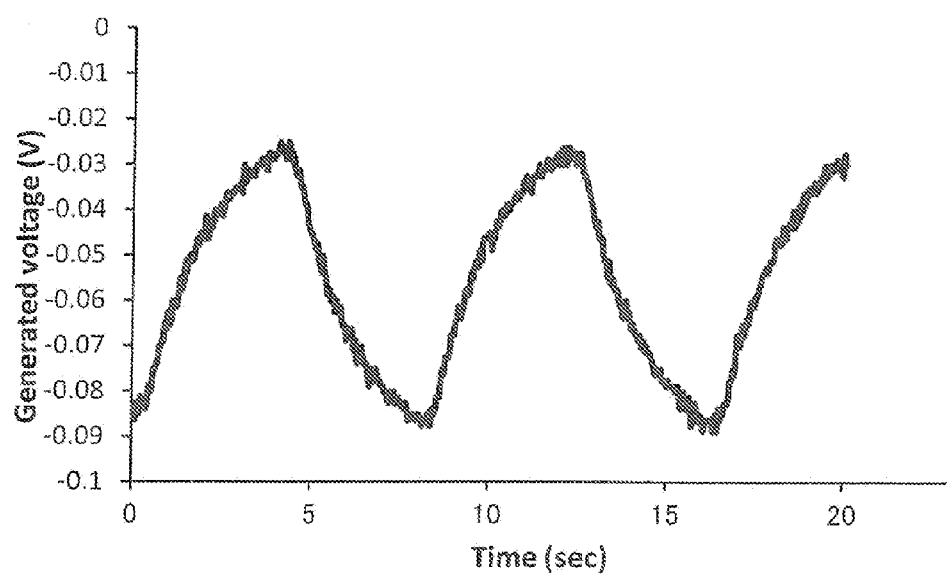
FIG. 9 is a graph illustrating the relationship between the generated voltage and the application period of intermittent light (chopping frequency: 0.12 Hz) obtained in Example 2.
Figure 10:
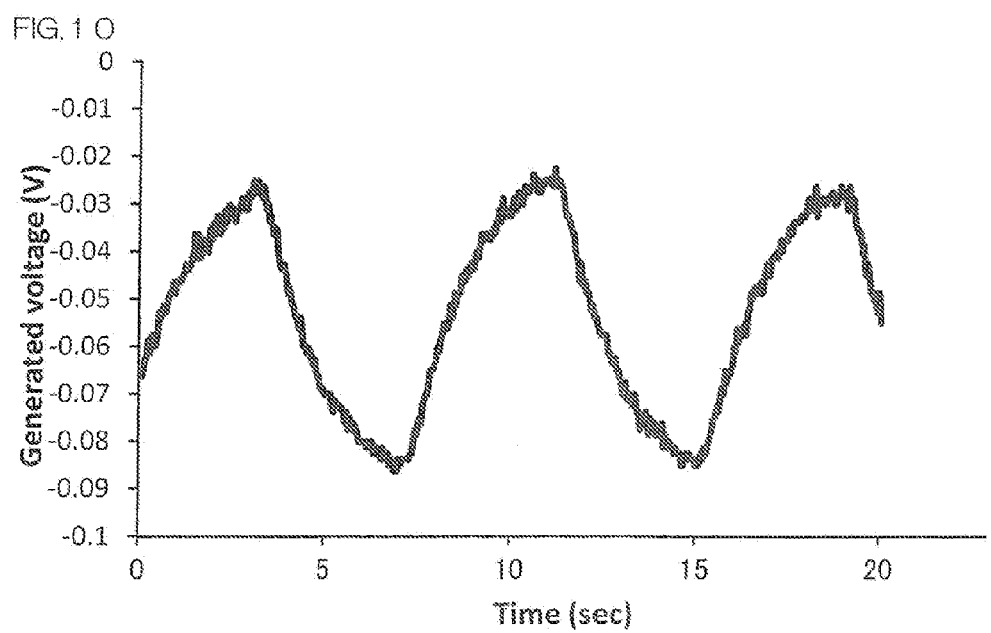
FIG. 10 is a graph illustrating the relationship between the generated voltage and the application period of intermittent light (chopping frequency: 0.13 Hz) obtained in Example 2.
Figure 11:
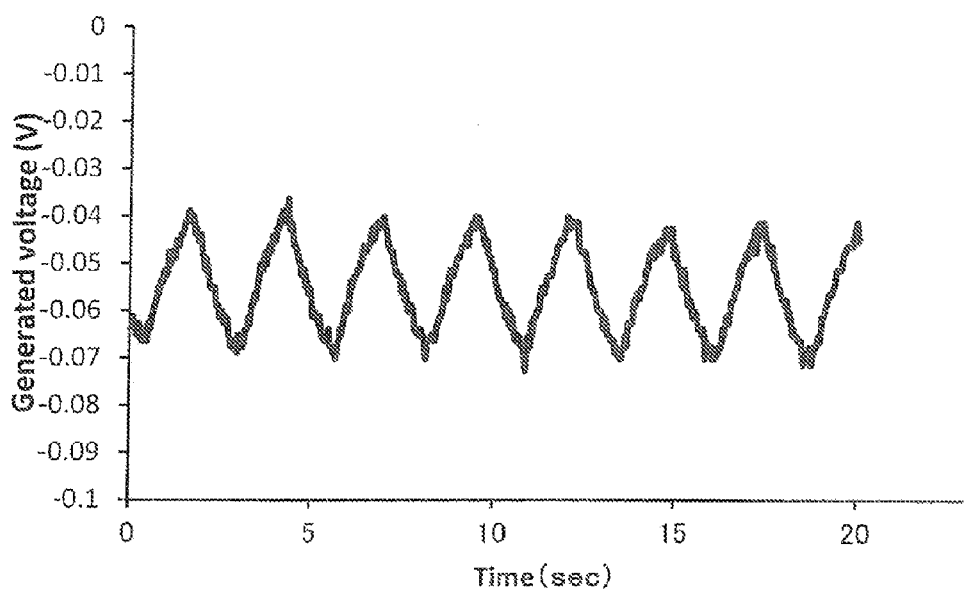
FIG. 11 is a graph illustrating the relationship between the generated voltage and the application period of intermittent light (chopping frequency: 0.38 Hz) obtained in Example 2.
Figure 12:
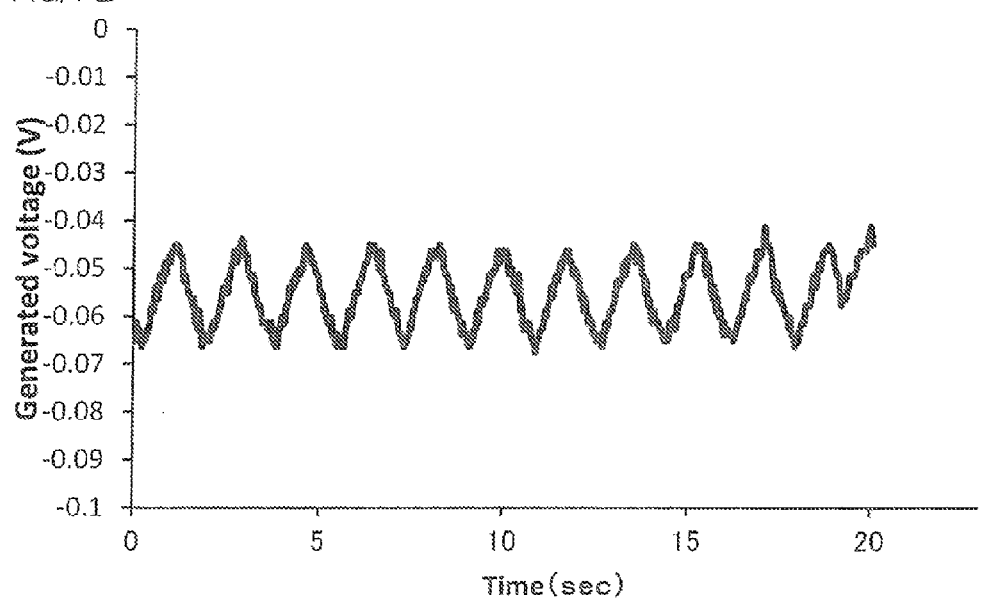
FIG. 12 is a graph illustrating the relationship between the generated voltage and the application period of intermittent light (chopping frequency: 0.56 Hz) obtained in Example 2.
Figure 13:
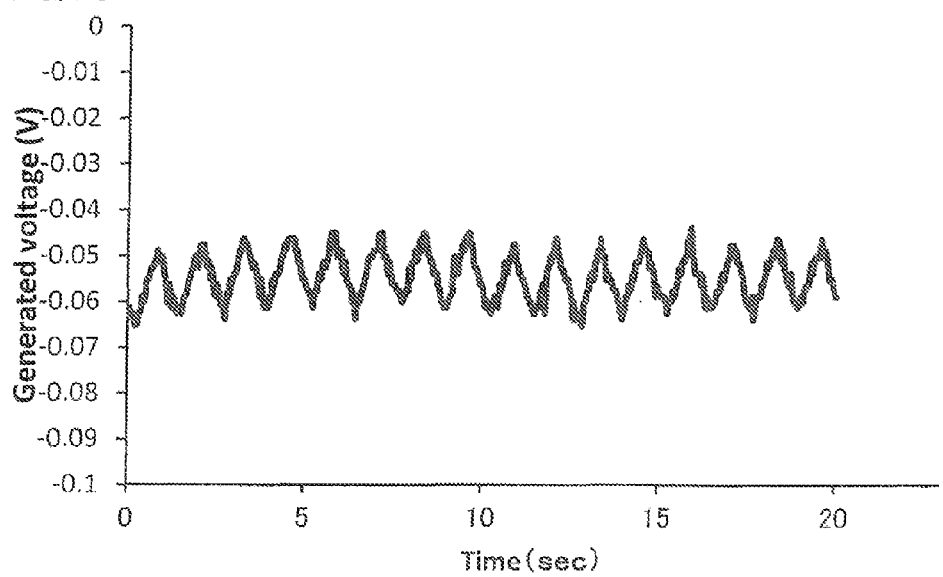
FIG. 13 is a graph illustrating the relationship between the generated voltage and the application period of intermittent light (chopping frequency: 0.80 Hz) obtained in Example 2.
Figure 14:
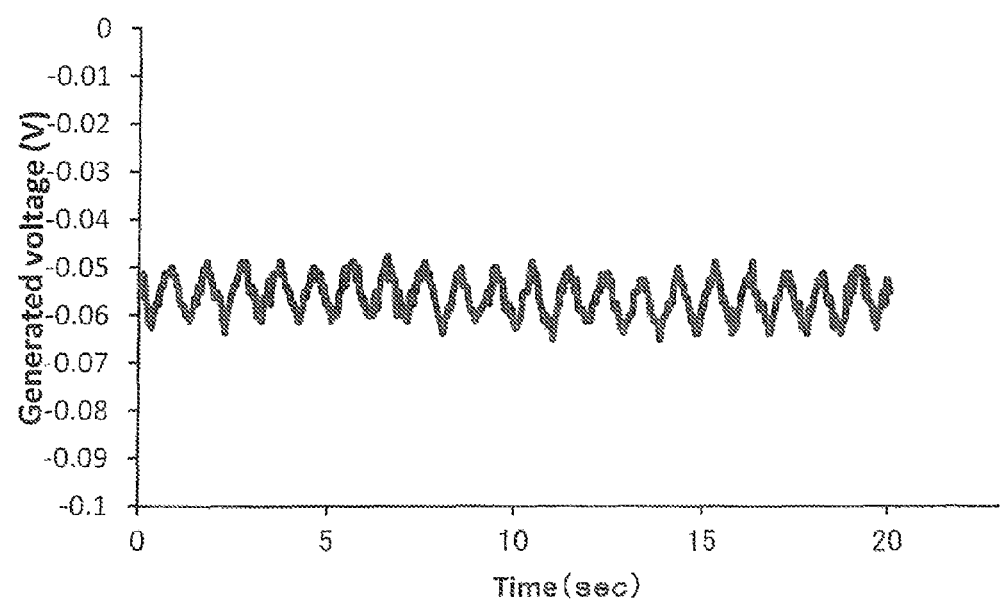
FIG. 14 is a graph illustrating the relationship between the generated voltage and the application period of intermittent light (chopping frequency: 1.06 Hz) obtained in Example 2.

The application period of the intermittent light was observed, and the voltage change of the electric power taken out from the thermoelectric element was observed by the oscilloscope 27. The relationship between the generated voltage and application period of the intermittent light is shown in FIG. 9.

The chopping frequency of the chopper was set to 0.13 Hz, 0.38 Hz, 0.56 Hz, 0.80 Hz, and 1.06 Hz, and the voltage change of the electric power taken out from each of the thermoelectric element was measured with the oscilloscope 27. The relationship between the generated voltage and application period of the intermittent light is shown in FIG. 10, FIG. 11, FIG. 12, FIG. 13, and FIG. 14.

(Examination)

As is clear from Examples 1 and 2, with such a power-generating system, from a heat source having a temperature that goes up and down over time (changes periodically), an electric power can be taken out as a waveform that changes in accordance with the changes.

Furthermore, as is clear from Example 2, an electric power can be taken out with the maximum power generation efficiency when the period of the temperature change is long.

Example 3

Piezoelectric Effect 1

A thin piezoelectric element (Composition: $Pb(Zr,Ti)O_3$, product number: VSB50EWHO301B, type: circular flying lead, tone type: external drive, size: diameter 50 mm, electrostatic capacity: 600 nF [120 Hz], impedance: 300Ω [1 kHz], resonance frequency: 400 Hz, oscillation frequency band:

250 Hz to 20 kHz, manufactured by Murata Manufacturing Co. Ltd.) was connected to a voltmeter (input resistance: 10MΩ).

A dryer (jet air temperature: 50 to 200° C.) was used as the heat source. The dryer and piezoelectric element were positioned so that the jet of the dryer was directed at the piezoelectric element, and the jet was distant from the piezoelectric element by 5 cm.

By blowing hot air from the dryer, and switching ON/OFF the dryer over time, the temperature was allowed to go up and down over time. This temperature change caused electric polarization in the piezoelectric element, and the generated voltage (electric power) was taken out via the electrode and the lead wire.

In the heating and cooling by the dryer, first, heating/cooling was switched at heating/cooling=10 s/20 s cycle, and thereafter, heating/cooling was switched at heating/cooling=5 s/15 s cycle.

Then, the voltage change of the electric power taken out from the piezoelectric element was observed with the voltmeter.

Figure 15:
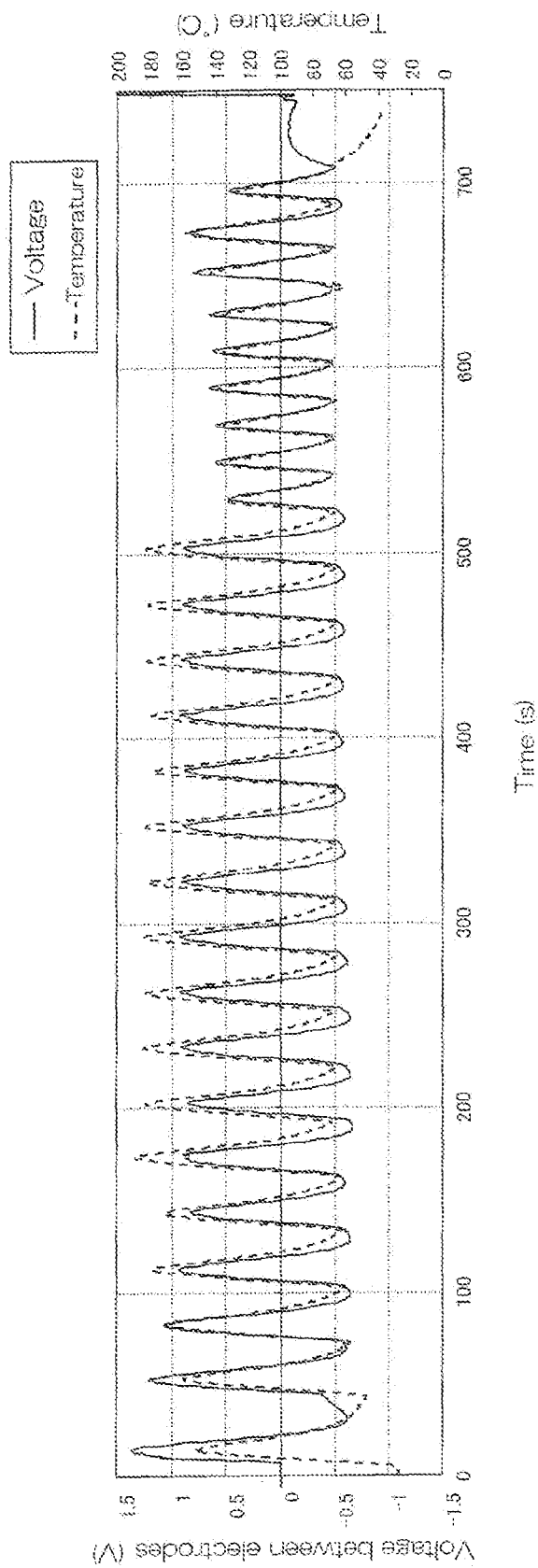
FIG. 15 is a graph illustrating the relationship between the generated voltage and the application period of hot air obtained in Example 3.

The relationship between the generated voltage and the temperature change is shown in FIG. 15.

Figure 16:
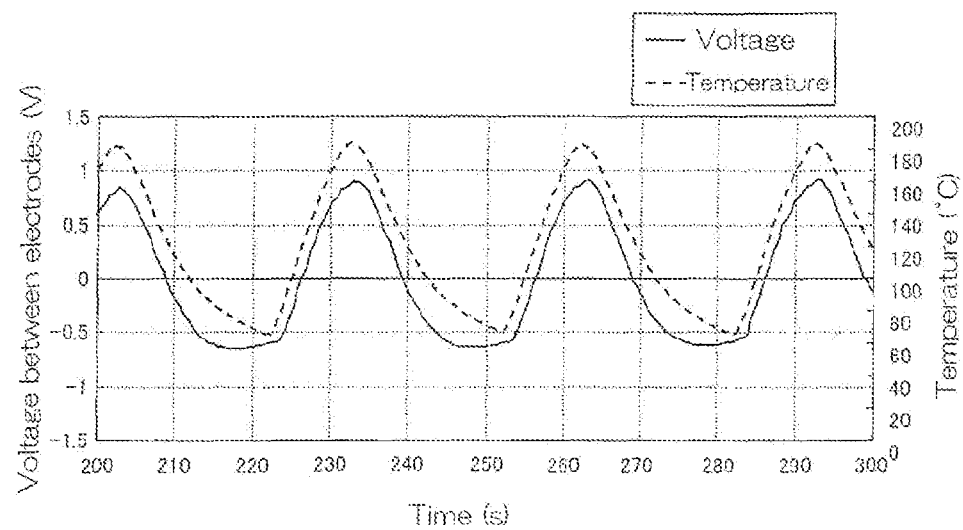
FIG. 16 shows an enlarged portion of FIG. 15, in the range where heating/cooling=10 s/20 s.
Figure 17:
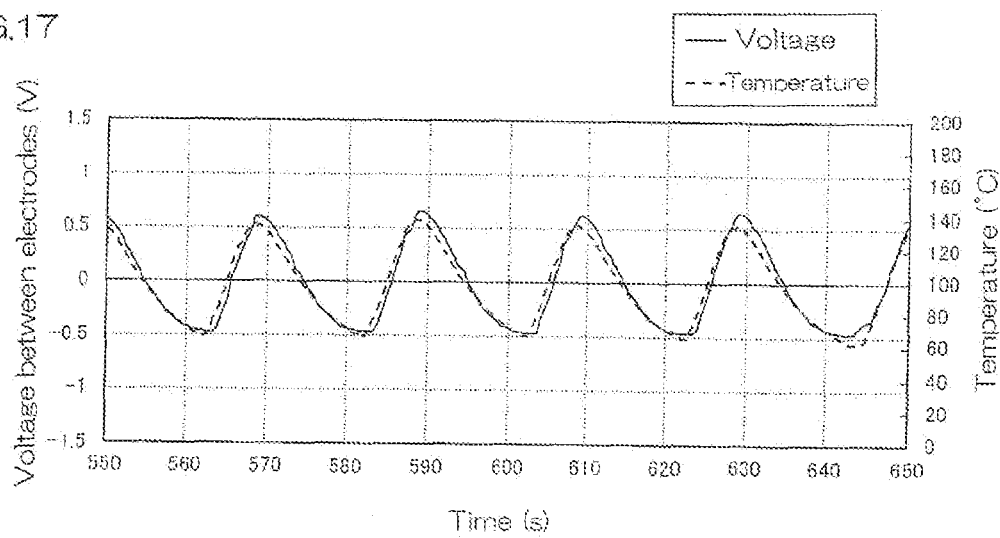
FIG. 17 shows an enlarged portion of FIG. 15, in the range where heating/cooling=5 s/15 s.

Furthermore, FIG. 16 shows an enlarged portion of FIG. 15, in the range where heating/cooling=10 s/20 s, and FIG. 17 shows an enlarged portion of FIG. 15, in the range where heating/cooling=5 s/15 s.

Example 4

Piezoelectric Effect 2

A bulk piezoelectric element (Composition: Nb and Sn added PZT (Nb/Sn/Pb(Zr,Ti)$O_3$), product number: HSC, manufactured by Sumitomo Metal (SMI) Electronics Devices Inc.) was connected to a voltmeter (input resistance: 10 MΩ).

A dryer (jet air temperature: 50 to 300° C.) was used as the heat source. The dryer and piezoelectric element were positioned so that the jet of the dryer was directed at the piezoelectric element, and the jet was distant from the piezoelectric element by 5 cm.

By blowing hot air from the dryer, and switching ON/OFF the dryer over time, the temperature was allowed to go up and down over time. This temperature change caused electric polarization in the piezoelectric element, and the generated voltage (electric power) was taken out via the electrode and the lead wire.

Figure 18:
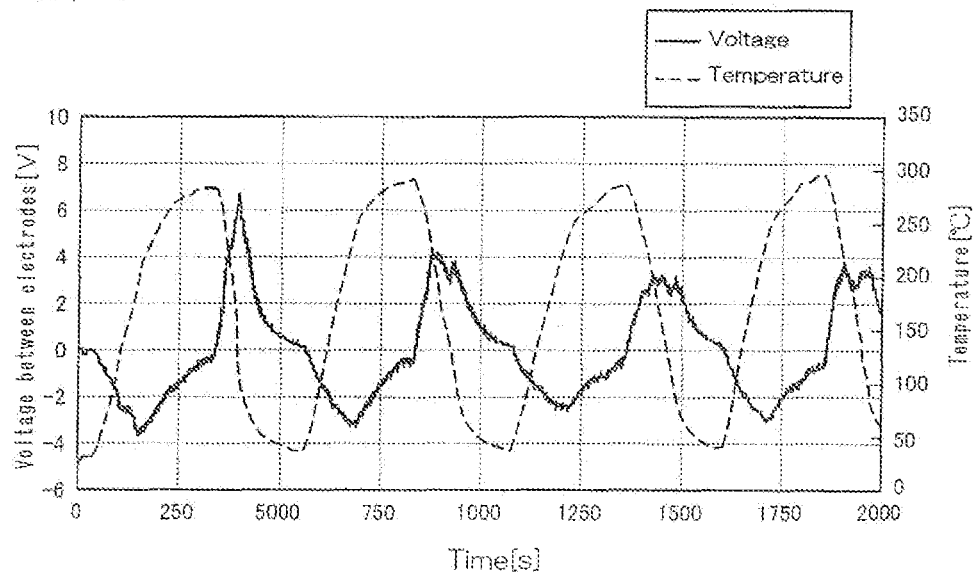
FIG. 18 is a graph illustrating the relationship between the generated voltage and the application period of hot air (heating/cooling=250 s/250 s) obtained in Example 4.

In the heating and cooling by the dryer, first, the heating/cooling was switched at heating/cooling=250 s/250 s cycle. Then, the voltage change of the electric power taken out from the piezoelectric element was observed with the voltmeter. The relationship between the generated voltage and the temperature change is shown in FIG. 18.

Figure 19:
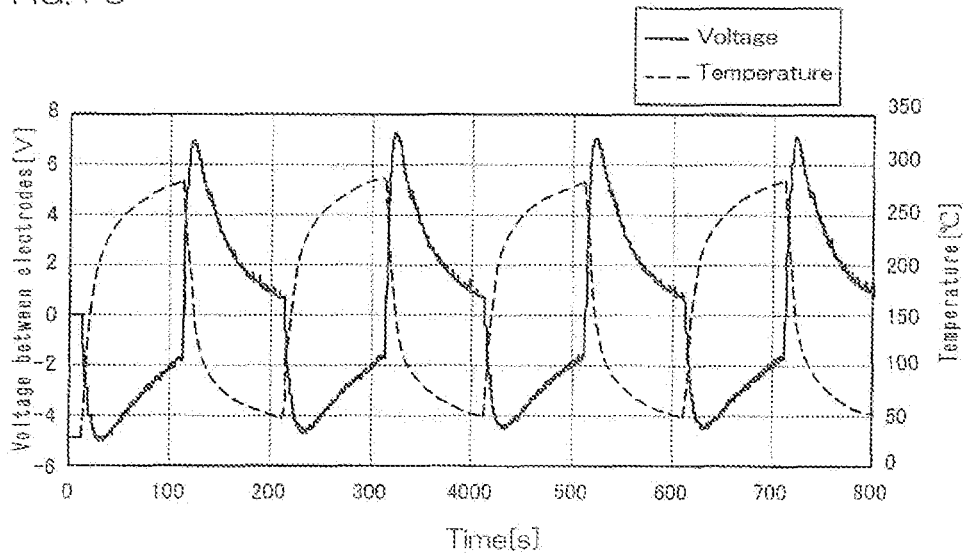
FIG. 19 is a graph illustrating the relationship between the generated voltage and the application period of hot air (heating/cooling=100 s/100 s) obtained in Example 4.

Furthermore, heating/cooling was switched at heating/cooling=100 s/100 s cycle, and in the same manner, the voltage change of the electric power taken out from the piezoelectric element was observed with the voltmeter. The relationship between the generated voltage and the temperature change is shown in FIG. 19.

Figure 20:
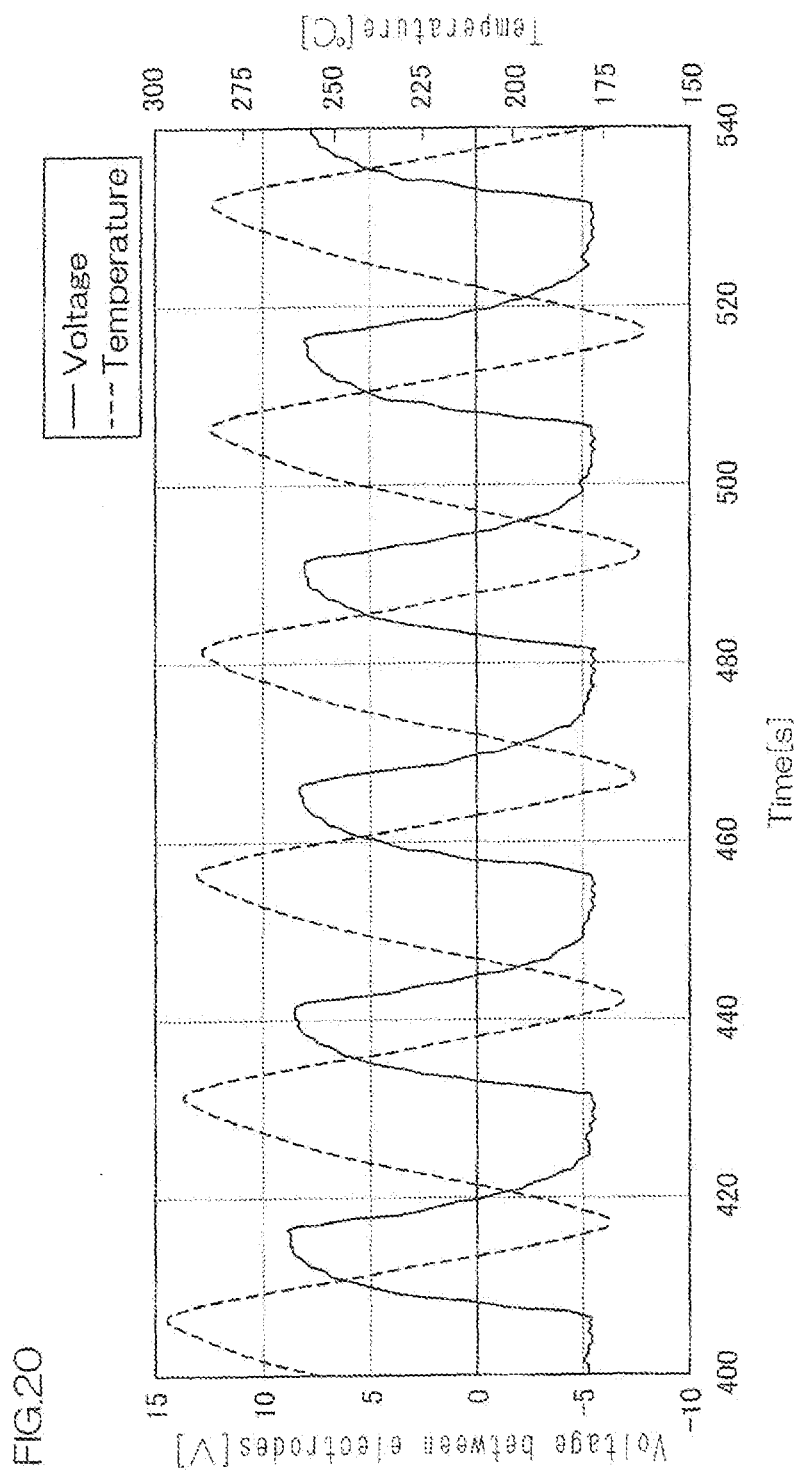
FIG. 20 is a graph illustrating the relationship between the generated voltage and the application period of hot air (heating/cooling=10 s/15 s) obtained in Example 4.

Furthermore, heating/cooling was switched at heating/cooling=10 s/15 s cycle, and in the same manner, the voltage change of the electric power taken out from the piezoelectric element was observed with the voltmeter. The relationship between the generated voltage and the temperature change is shown in FIG. 20.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

A power-generating system of the present invention is suitably used as a device that recovers the heat energy released from those various energy-using devices including internal combustion engines including an automobiles engine, heat exchanger including a boiler, and air-conditioning equipment, motor generators including a power generator and a motor, and luminous device including lightings, and reuses the heat energy as an energy source.

The invention claimed is:

1. A power-generating system comprising:
a heat source having a temperature that goes up and down over time;
a first device that undergoes electric polarization due to the temperature change of the heat source; and
a second device that takes out an electric power from the first device,
wherein the heat source is an internal combustion engine that includes a multicylinder engine and an exhaust manifold, the exhaust manifold including a plurality of branch pipes connected to cylinders of the engine and a collection pipe that integrates the branch pipes at a downstream side of the branch pipes, the collection pipe having a downstream end portion being connected to an upstream end portion of a catalyst mount portion,
wherein the first device is disposed at at least one of the branch pipes at a location upstream of both the collection pipe and the catalyst mount portion where the at least one branch pipe undergoes a periodic temperature change,
wherein the first device is a pyroelectric element and/or a piezoelectric element,
wherein the Curie point of the first device is −77° C. or more and 1300° C. or less, and
wherein the relative dielectric constant of the first device is 1 or more.

2. The power-generating system according to claim 1, wherein the second device takes out an electric power expressed as a periodically changing waveform.

3. The power-generating system according to claim 1, wherein the at least one branch pipe comprises a plurality of branch pipes of the exhaust manifold of the internal combustion engine, and wherein there is a corresponding said first device disposed at each one of the plurality of branch pipes so that there are a plurality of first devices and a plurality of corresponding second devices.

4. The power-generating system according to claim 3, wherein the periodic temperature change of at least one of the plurality of branch pipes occurs at a same period but at a different phase than the periodic temperature change of at least one other of the plurality of branch pipes, such that the electric power is taken from the plurality of first devices via the plurality of corresponding second devices as a periodically changing waveform.

5. A power-generating system comprising:
a heat source having a temperature that goes up and down over time;
a first device that undergoes electric polarization due to the temperature change of the heat source; and a second device that takes out an electric power from the first device, wherein the heat source is an internal combustion engine that includes a multicylinder engine and an exhaust manifold, the exhaust manifold including a plurality of branch pipes connected to cylinders of the engine and a collection pipe that integrates the branch pipes at a downstream side of the branch pipes, the collection pipe having a downstream end portion being connected to an upstream end portion of a catalyst mount portion, wherein there is a corresponding said first device disposed at each one of the plurality of branch pipes at a location upstream of the catalyst mount portion where each one of the plurality of branch pipes undergoes a periodic temperature change, so that there are a plurality of first devices and a plurality of corresponding second devices, and wherein the periodic temperature change of at least one of the plurality of branch pipes occurs at a same period but at a different phase than the periodic temperature change of at least one other of the plurality of branch pipes, such that the electric power is taken from the plurality of first devices via the plurality of corresponding second devices as a periodically changing waveform.

\* \* \* \* \*